(12) United States Patent
Kwark et al.

(10) Patent No.: US 7,375,290 B1
(45) Date of Patent: May 20, 2008

(54) PRINTED CIRCUIT BOARD VIA WITH RADIO FREQUENCY ABSORBER

(76) Inventors: Young Hoon Kwark, 16 Garey Dr., Chappaqua, NY (US) 10514; Christian Schuster, Richardt-Schmidt-Str. 46, Buchholz, Niedersachsen (DE) 21244

( * ) Notice: Subject to any disclaimer, the term of this patent is extended or adjusted under 35 U.S.C. 154(b) by 52 days.

(21) Appl. No.: 11/545,921

(22) Filed: Oct. 11, 2006

(51) Int. Cl.
*H01B 17/00* (2006.01)
(52) U.S. Cl. .................. 174/262; 333/246; 333/260; 174/260; 174/261; 174/264; 174/266; 361/792; 361/793; 361/794; 361/795; 361/816; 361/818
(58) Field of Classification Search .............. 174/262, 174/266, 265; 361/792, 793–795, 760
See application file for complete search history.

(56) References Cited

U.S. PATENT DOCUMENTS

| | | | |
|---|---|---|---|
| 5,819,401 A * | 10/1998 | Johannes et al. ............ 29/830 |
| 6,138,350 A * | 10/2000 | Bhatt et al. .................. 29/852 |
| 6,388,204 B1 * | 5/2002 | Lauffer et al. ............... 174/261 |
| 6,538,538 B2 | 3/2003 | Hreish et al. |
| 6,541,712 B1 | 4/2003 | Gately et al. |
| 6,621,012 B2 | 9/2003 | Crockett et al. |
| 6,661,316 B2 | 12/2003 | Hreish et al. |
| 6,937,120 B2 * | 8/2005 | Fisher et al. ................. 333/246 |
| 6,983,535 B2 | 1/2006 | Crockett et al. |
| 7,045,719 B1 * | 5/2006 | Alexander et al. .......... 174/262 |
| 2004/0212972 A1 | 10/2004 | Khilchenko et al. |
| 2004/0238216 A1 | 12/2004 | Jessep et al. |
| 2005/0230813 A1 | 10/2005 | Nakamura et al. |
| 2006/0121722 A1 * | 6/2006 | Card et al. .................. 438/622 |

* cited by examiner

*Primary Examiner*—Tuan T. Dinh
*Assistant Examiner*—Andargie Aychillhum
(74) *Attorney, Agent, or Firm*—Robert D. Morelli

(57) ABSTRACT

A printed circuit board with vias that reduce or eliminate radio frequency interference and method of forming the same. The printed circuit board includes non-conductive layers, conductive-layers interspersed between the non-conductive layers, vias extending through the non-conductive layers and the conductive layers, radio frequency absorbing material within each of the vias, where the radio frequency absorbing material is at a conductive layer within the printed circuit board at which a conductive trace is not connected to a via, an insulating layer over each radio frequency absorbing material, and a cylindrical conductive material within via and over each insulating layer.

14 Claims, 4 Drawing Sheets

PRINTED CIRCUIT BOARD VIA WITH RADIO FREQUENCY ABSORBER

FIELD OF INVENTION

The present invention relates, in general, to electrical connectors and, in particular, to a preformed panel circuit arrangement.

BACKGROUND OF THE INVENTION

Non-conductive circuit boards printed with conductive traces, commonly referred to as Printed Circuit Boards (PCBs), are used extensively in commercial electronics. Electronic components are connected to a PCB, and the traces are formed to realize the desired connection there between. The first PCBs were one non-conductive layer with one layer for the conductive traces, or interconnect. To reduce the size of PCBs or to make it possible to realize a complicated circuit, multi-level PCBs were developed.

A multi-level PCB consists of multiple non-conductive layers interspersed with interconnect layers. A via through a layer of a PCB is used to connect a conductive trace on one interconnect layer with that of another. FIGS. 1A-1C illustrate the construction of a via on a multi-layered PCB.

In FIG. 1A is a cross-sectional view of a portion of a PCB 1 showing multiple layers of non-conductive material 2 and multiple layers of conductive traces (i.e., a trace on the top of the PCB, 5 layers of traces within the PCB, and one trace on the bottom of the PCB. In the example, the second 3 and fourth 4 embedded traces, counting from the top of the PCB, are desired to be connected by a via. Epoxy reinforced with fiberglass is typically used for the non-conductive layers 2. Copper is typically used for the conductive traces.

FIG. 1B is a cross-sectional view of the PCB of FIG. 1A, where a hole has been drilled through the PCB and through the second 3 and fourth 4 embedded traces.

FIG. 1C is a cross-sectional view of the PCB of FIG. 1B, where conductive material 6 has been plated in the formed in FIG. 1B. The plated material electrically connects the second 3 and fourth conductive traces, but does not connect to any other conductive trace.

The frequency at which electronic components can operate has steadily increased over the years. To realize the maximum operating frequency of an electronic component, resistance and dielectric losses of the interconnect layers connected to the component should be minimized. However, increased operating frequencies with their attendant shorter wavelengths increase the likelihood of generating radio frequency interference (RFI) on a PCB. FIG. 2 illustrates one possible way of generating RFI on a PCB.

FIG. 2 is a cross-sectional view of a portion of a PCB 21. The PCB 21 includes a first via 22 and a second via 23. The first via 22 electrically connects a first conductive trace 24 on the second embedded conductive layer of the PCB, counting from the top of the PCB, to a second conductive trace 25 on the fifth embedded conductive layer. The second via 23 connects the second conductive trace 25 to a third conductive trace 26 on the same embedded conductive layer as well as possibly to a surface mounted component. A first arrow 27 indicates the preferred path of a signal traversing the interconnection formed by the vias 22, 23, and the conductive traces 24, 25, 26. However, at a sufficiently high frequency, RFI may be created when the intended signal encounters a via. Two examples of this are indicated by the second arrow 28 and the third arrow 29. The second arrow 28 indicates RFI that traverses the PCB, guided by solid plane layers 26A and 26B, whereas the third arrow 29 indicates RFI that reflects off of the second via 23. The fourth arrow 29A indicates energy that can be resonantly amplified by the high Q via stubs associated with via 23. Since RFI can disrupt operation of electronic components on or off of the PCB, there is a need to reduce or eliminate such RFI.

U.S. Pat. Nos. 6,538,538 and 6,661,316, each entitled "HIGH FREQUENCY PRINTED CIRCUIT BOARD VIA," disclose a via that includes a conductive pad surrounding the conductor and embedded within the PCB to increase the frequency at which electronics can operate. Such a via increases the likelihood of generating RFI, not reduces or eliminates RFI as does the present invention. U.S. Pat. Nos. 6,538,538 and 6,661,316 are hereby incorporated by reference into the specification of the present invention.

U.S. Pat. No. 6,541,712 entitled "HIGH SPEED MULTI-LAYER PRINTED CIRCUIT BOARD VIA," discloses a via for eliminating or reducing RFI caused by a via by reducing the length of the via using an insulator. The present invention does not reduce the length of a via using an insulator as does U.S. Pat. No. 6,541,712. U.S. Pat. No. 6,541,712 is hereby incorporated by reference into the specification of the present invention.

U.S. Pat. No. 6,621,012, entitled "INSERTION OF ELECTRICAL COMPONENT WITHIN A VIA OF A PRINTED CIRCUIT BOARD," discloses a method of reducing impedance of a via by inserting an electrical component into the via. Reducing impedance does not necessarily eliminate RFI as does the present invention. U.S. Pat. No. 6,621,012 is hereby incorporated by reference into the specification of the present invention.

U.S. Pat. No. 6,983,535, entitled "INSERTION OF ELECTRICAL COMPONENT WITHIN A VIA OF A PRINTED CIRCUIT BOARD," discloses a method of reducing impedance of a via by inserting an electrical component into the via. Reducing impedance does not necessarily eliminate RFI as does the present invention. U.S. Pat. No. 6,983,535 is hereby incorporated by reference into the specification of the present invention.

U.S. Pat. Appl. No. 20040212972, entitled "PRINTED CIRCUIT BOARD MINIMIZING UNDESIRABLE SIGNAL REFLECTIONS IN A VIA AND METHODS THEREOF," discloses a method of minimizing signal reflectance by avoiding long conductive vias and using, instead, non-conductive vias and inserting conductive elements into the via to connect conductive traces on either side of the via, where the conductive element is only long enough to connect the conductive traces, but not long enough to cause signal reflections. The present invention does not employ non-conductive vias and conductive elements that are only large enough to make the desired connection. U.S. Pat. Appl. No. 20040212972 is hereby incorporated by reference into the specification of the present invention.

U.S. Pat. Appl. No. 20040238216, entitled "VIA SHIELDING FOR POWER/GROUND LAYERS ON PRINTED CIRCUIT BOARD," discloses a method of adding an insulating material around a conductive layer to prevent short circuits with a power or ground line if a via hole is drilled improperly. U.S. Pat. Appl. No. 20040238216 does not reduce or eliminate RFI as does the present invention. U.S. Pat. Appl. No. 20040238216 is hereby incorporated by reference into the specification of the present invention.

U.S. Pat. Appl. No. 20050230813, entitled "PRINTED CIRCUIT BOARD INCLUDING VIA CONTRIBUTING TO SUPERIOR CHARACTERISTIC IMPEDANCE," discloses a method of forming a conductive ring around a via to facilitate impedance matching and, thus, better suppress noise. The present invention does not employ a conductive ring around a via as does U.S. Pat. Appl. No. 20050230813. U.S. Pat. Appl. No. 20050230813 is hereby incorporated by reference into the specification of the present invention.

SUMMARY OF THE INVENTION

It is an object of the present invention to form a via on a printed circuit board (PCB) to reduce or eliminate the generation of radio frequency interference (RFI).

It is another object of the present invention to fabricate a via on a PCB to reduce or eliminate the generation of RFI by forming an radio frequency absorbing layer on sections within a via where conductive layers do not connect to the via.

The present invention is a PCB that includes at least one via for reducing or eliminating the generation of RFI.

The printed circuit board includes a plurality of non-conductive layers.

The printed circuit board also includes a plurality of conductive-layers interspersed between the plurality of non-conductive layers;

At least one via extends through the plurality of non-conductive layers and the plurality of conductive layers.

A plurality of radio frequency absorbing material is within each of the at least one via, where each plurality of radio frequency absorbing material is located at depths corresponding to conductive layers within the printed circuit board at which a conductive trace is not connected to the corresponding at least one via.

An insulating layer is over each radio frequency absorbing material.

A cylindrical conductive material is within each at least one via and over each insulating layer.

DETAILED DESCRIPTION

The present invention is a printed circuit board (PCB) that includes at least one via that reduces or eliminates radio frequency interference (RFI) and a method of making the same.

High speed signals that transit through vias can launch propagating modes resulting in RFI in PCB cavities formed by ground and power planes because the conductive walls of a via acts as a signal reflector without providing any dampening of the reflected signal. Prior art PCBs are designed to minimize losses in dielectrics (i.e., non-conductive layers) and conductive layers in order to preserve signal integrity. Because of this, PCBs provide very little damping of RFI. This leads to considerable noise coupling to other signals that propagate along vias.

FIGS. 3A-3E are cross-sectional views of the construction of a via of the present invention.

Figures 1A, 1B, 1C:
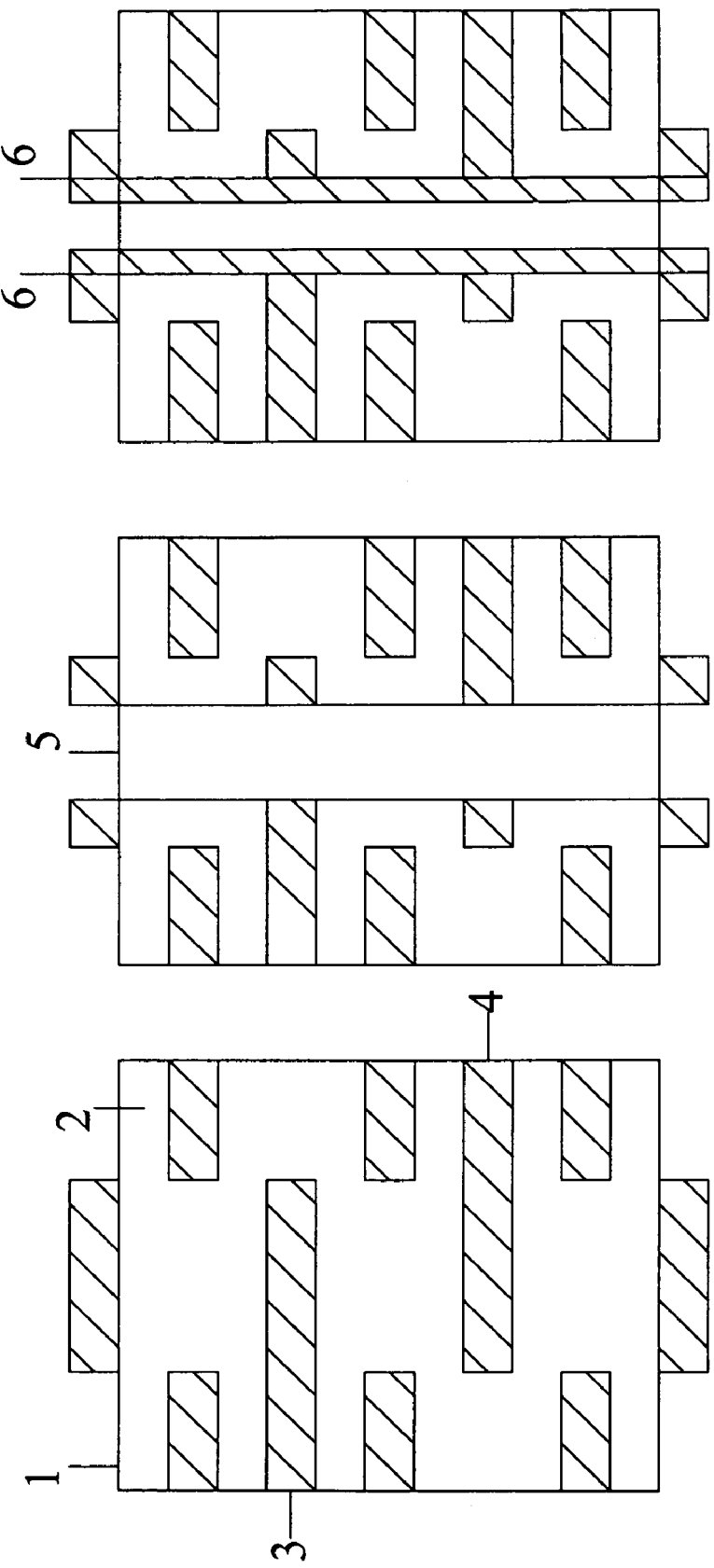
FIG. 1A-1C are cross-sectional views of the construction of a prior art via.
Figure 2:
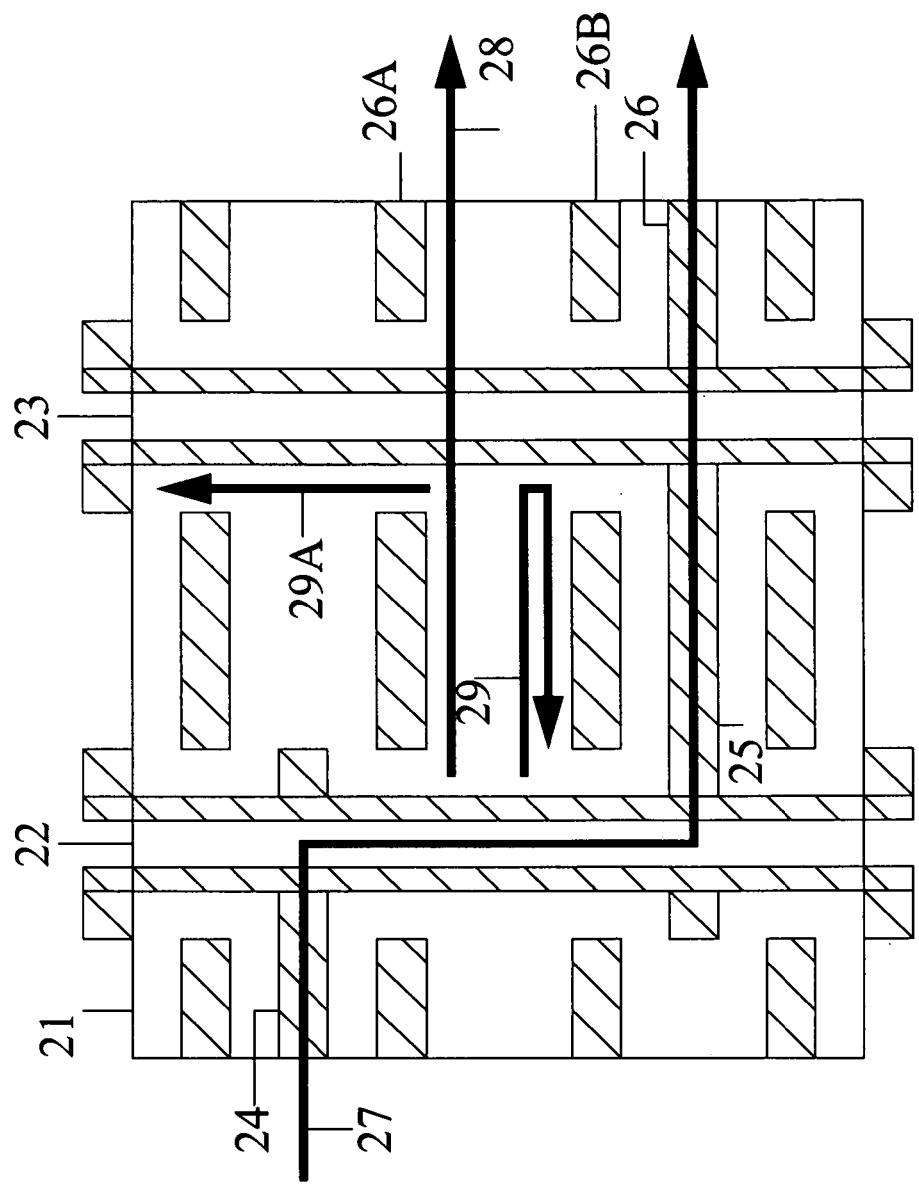
FIG. 2 is a cross-sectional view of the generation of RFI in a prior art via.
Figures 3A, 3B, 3C:
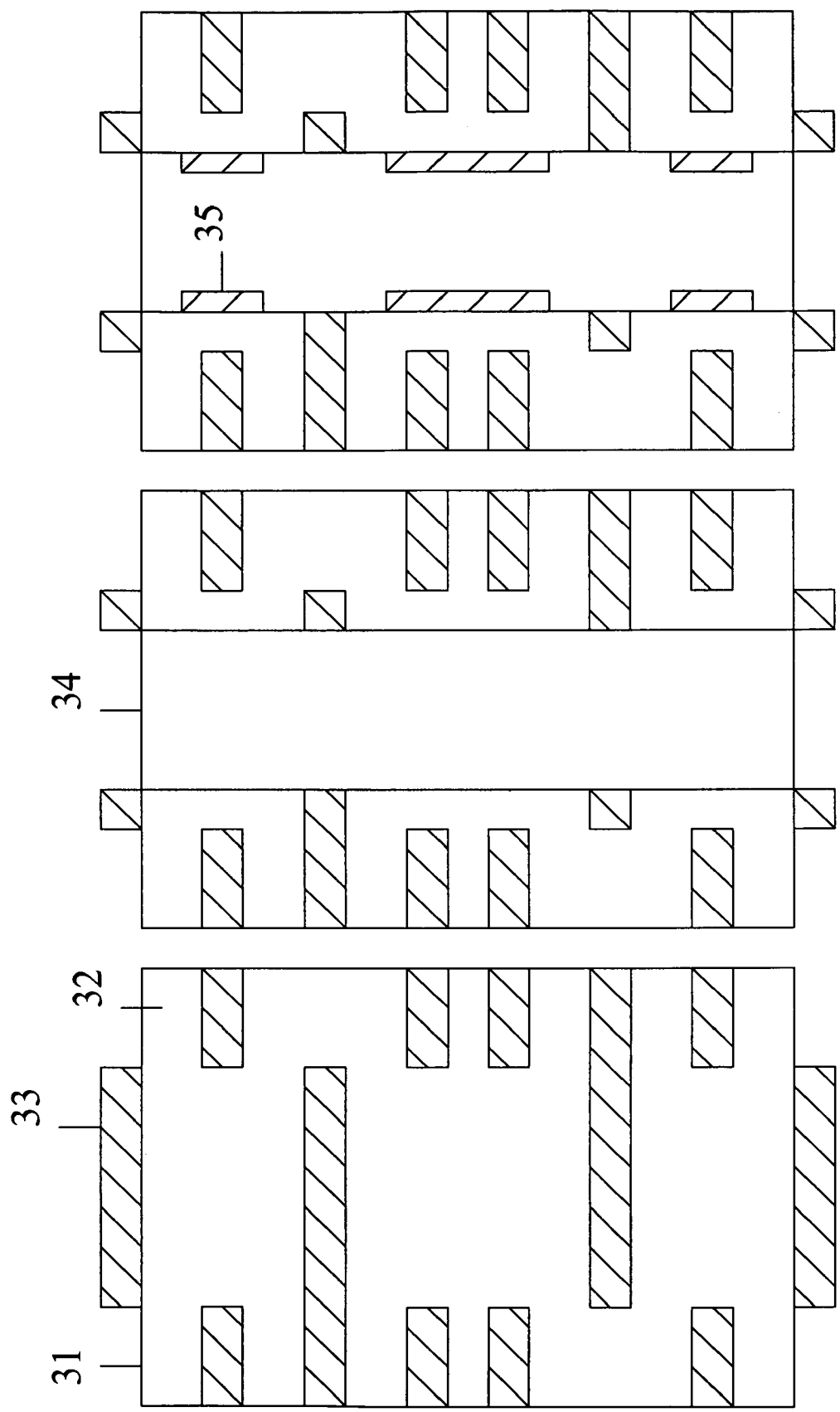
FIGS. 3A-3E are cross-sectional views of the construction of a via of the present invention.

In FIG. 3A, which is not to scale, an exemplary PCB 31 is formed as a laminated stack of non-conductive layers 32 and conductive layers 33. In the preferred embodiment, the non-conductive layers 32 are non-conductive epoxy reinforced with fiberglass, and the conductive layers 33 includes copper. However, any other suitable non-conductive layer 32 or conductive layer 33 may be used in the present invention.

In FIG. 3B, vias 34 are defined. In the preferred embodiment, vias 34 are defined by mechanical drilling in appropriate locations (i.e., through the conductive traces 33 on different conductive layers 33 that are desired to be connected by a via 34).

In FIG. 3C, a plurality of radio frequency absorbing material 35 is formed within each of the at least one via 34 formed in FIG. 3B. Each radio frequency absorbing material 35 is at a conductive layer 33 within the PCB 31 at which a conductive trace 33 is not connected to via 34. The radio frequency absorbing material 35 acts to dampen RFI generated in the PCB 31. By placing such absorbing material everywhere within a via 34 except where a conductive trace 33 connects to the via 34, any RFI is dampened and only the intended signal is propagated through the via 34. In the preferred embodiment, the radio frequency absorbing material 35 is a resistive material such as polyimide loaded with carbon, but any other suitable resistive material may be used in the present invention.

Figure 3E:
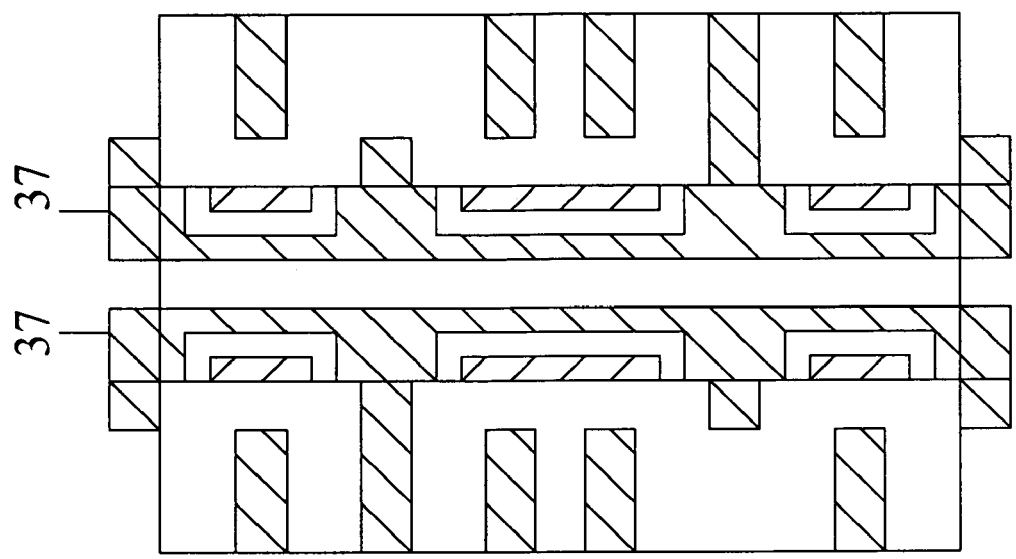
Figure 3D:
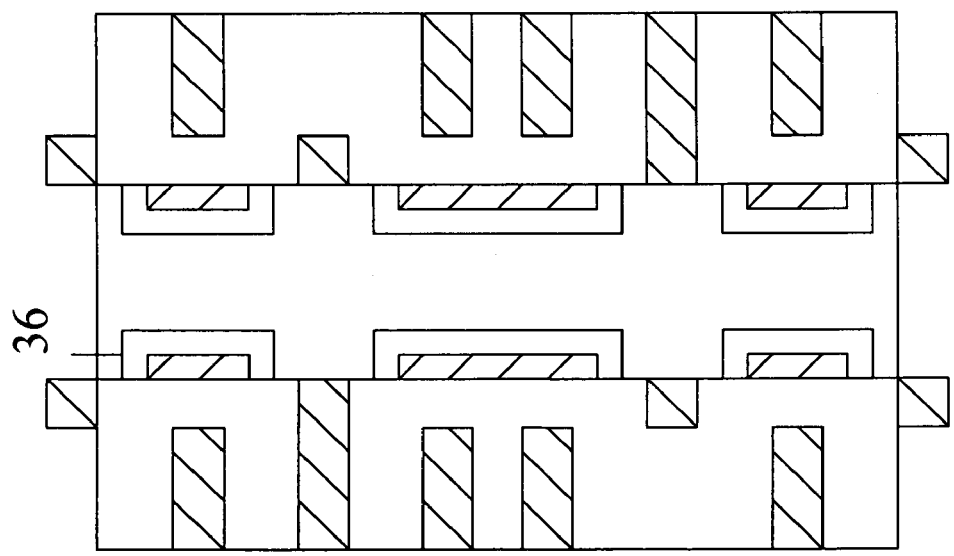

In FIG. 3D, an insulating layer 36 is formed over each radio frequency absorbing material 35 formed in FIG. 3C. The insulating layer 36 in FIG. 3D insures isolation between that the radio frequency absorbing material 35 and the conductive material that is to line the via 34, which is described below. A connection between the radio frequency absorbing material 35 and the conductive material that is to line the via 34 would defeat, or severely degrade, the dampening properties of the radio frequency absorbing material 35. In the preferred embodiment, the insulating layer 36 is an oxide, but any other suitable insulating material may be used in the present invention.

In FIG. 3E, a cylindrical conductive material 37 is formed within each at least one via 34 and over each insulating layer 36. The cylindrical conductive material 37 electrically connects the conductive traces that are to be connected. In the preferred embodiment, the cylindrical conductive material includes copper. However, any other suitable conductive material may be used in the present invention.

What is claimed is:

1. A printed circuit board, comprising:
   a) a plurality of non-conductive layers;
   b) a plurality of conductive-layers interspersed between the plurality of non-conductive layers;
   c) at least one via extending through the plurality of non-conductive layers and the plurality of conductive layers;
   d) a plurality of radio frequency absorbing material within each of the at least one via, where each plurality of radio frequency absorbing material is at a depth within the printed circuit board corresponding to a conductive layer within the printed circuit board at which a conductive trace is not connected to the corresponding at least one via;
   e) an insulating layer over each radio frequency absorbing material; and
   f) a cylindrical conductive material within each at least one via and over each insulating layer.

2. The device of claim 1, wherein the plurality of non-conductive layers is comprised of non-conductive epoxy reinforced with fiberglass.

3. The device of claim 1, wherein the plurality of conductive layers include copper.

4. The device of claim 1, wherein the plurality of radio frequency absorbing material is comprised of resistive material.

5. The device of claim 1, wherein the insulating layer is comprised of an oxide.

6. The device of claim 1, wherein the cylindrical conductive material includes copper.

7. The device of claim 4, wherein the resistive material includes polyimide loaded with carbon.

8. A method of forming at least one via in a printed circuit board, comprising:
   a) forming a plurality of non-conductive layers;
   b) forming a plurality of conductive-layers interspersed between the plurality of non-conductive layers;
   c) forming at least one via extending through the plurality of non-conductive layers and the plurality of conductive layers;
   d) forming a plurality of radio frequency absorbing material within each of the at least one via, where each plurality of radio frequency absorbing material is at a depth within the printed circuit board corresponding to a conductive layer within the printed circuit board at which a conductive trace is not connected to the corresponding at least one via;
   e) forming an insulating layer over each radio frequency absorbing material; and
   f) forming a cylindrical conductive material within each at least one via and over each insulating layer.

9. The method of claim 8, wherein the step of forming a plurality of non-conductive layers is comprised of forming a plurality of non-conductive epoxy layers reinforced with fiberglass.

10. The method of claim 8, wherein the step of forming a plurality of conductive layers is comprised of the step of forming a plurality of layers that includes copper.

11. The method of claim 8, wherein the step of forming a plurality of radio frequency absorbing material is comprised of the step of forming a plurality of resistive material.

12. The method of claim 11, wherein the step of forming a plurality of resistive material is comprised of the step of forming a plurality of material that includes polyimide loaded with carbon.

13. The method of claim 8, wherein the step of forming an insulating layer is comprised of the step of forming a layer that includes oxide.

14. The method of claim 8, wherein the step of forming a cylindrical conductive material is comprised of the step of forming a cylindrical conductive material that includes copper.

* * * * *